(12) United States Patent
Son

(10) Patent No.: US 10,211,123 B2
(45) Date of Patent: Feb. 19, 2019

(54) SEMICONDUCTOR MEMORY DEVICE AND A CHIP STACK PACKAGE HAVING THE SAME

(71) Applicant: SAMSUNG ELECTRONICS CO., LTD., Suwon-si, Gyeonggi-Do (KR)

(72) Inventor: Jong-Pil Son, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/678,197

(22) Filed: Aug. 16, 2017

(65) Prior Publication Data

US 2018/0174941 A1 Jun. 21, 2018

(30) Foreign Application Priority Data

Dec. 15, 2016 (KR) .................. 10-2016-0172023

(51) Int. Cl.
*H01L 23/373* (2006.01)
*H01L 23/36* (2006.01)
(Continued)

(52) U.S. Cl.
CPC ........ *H01L 23/373* (2013.01); *H01L 21/4882* (2013.01); *H01L 23/36* (2013.01); *H01L 23/3677* (2013.01); *H01L 23/49568* (2013.01); *H01L 23/535* (2013.01); *H01L 23/538* (2013.01); *H01L 24/06* (2013.01); *H01L 24/09* (2013.01); *H01L 24/14* (2013.01); *H01L 24/17* (2013.01); *H01L 24/18* (2013.01); *H01L 25/0657* (2013.01); *H01L 25/18* (2013.01);
(Continued)

(58) Field of Classification Search
CPC ..... H01L 23/36; H01L 23/373; H01L 23/535; H01L 24/06; H01L 24/09; H01L 24/14; H01L 24/17; H01L 24/18; H01L 21/4882; H01L 23/3677; H01L 23/49568; H01L 2023/4037; H01L 2023/4043; H01L 2023/405; H01L 2023/4062; H01L 2023/4068
See application file for complete search history.

(56) References Cited

U.S. PATENT DOCUMENTS 8,174,098 B2 5/2012 Tay et al.
9,040,412 B2 5/2015 Ma et al.
(Continued)

FOREIGN PATENT DOCUMENTS

KR 10-0963207 6/2010

*Primary Examiner* — Fei Fei Yeung Lopez
(74) *Attorney, Agent, or Firm* — F. Chau & Associates, LLC

(57) ABSTRACT

A semiconductor memory device includes an integrated circuit (IC) chip structure, wherein the IC chip includes a substrate, a memory cell disposed on the substrate, and a local well disposed on the substrate, wherein a conductivity type of the local well is different from a conductivity type of the substrate, a wiring stack structure disposed on the IC chip structure, wherein the wiring stack structure includes a signal transfer pattern connected to the memory cell through a signal interconnector, and a thermal dispersion pattern connected to the local well through a thermal interconnector, and a heat transfer structure connected to the thermal dispersion pattern for transferring heat to the thermal dispersion pattern from a heat source.

20 Claims, 10 Drawing Sheets

(51) Int. Cl.
*H01L 25/18* (2006.01)
*H01L 27/118* (2006.01)
*H01L 27/108* (2006.01)
*H01L 23/535* (2006.01)
*H01L 23/00* (2006.01)
*H05K 1/18* (2006.01)
*H01L 21/48* (2006.01)
*H01L 23/495* (2006.01)
*H01L 23/367* (2006.01)
*H01L 23/538* (2006.01)
*H01L 25/065* (2006.01)
*H01L 23/31* (2006.01)
*H01L 23/40* (2006.01)

(52) U.S. Cl.
CPC ...... *H01L 27/10805* (2013.01); *H01L 27/118* (2013.01); *H05K 1/181* (2013.01); *H01L 23/3171* (2013.01); *H01L 2023/405* (2013.01); *H01L 2023/4037* (2013.01); *H01L 2023/4043* (2013.01); *H01L 2023/4062* (2013.01); *H01L 2023/4068* (2013.01); *H01L 2224/0401* (2013.01); *H01L 2224/04042* (2013.01); *H01L 2224/16145* (2013.01); *H01L 2224/17519* (2013.01); *H01L 2224/32145* (2013.01); *H01L 2224/48091* (2013.01); *H01L 2224/48227* (2013.01); *H01L 2224/73204* (2013.01); *H01L 2224/73207* (2013.01); *H01L 2224/73253* (2013.01); *H01L 2224/73265* (2013.01); *H01L 2225/0651* (2013.01); *H01L 2225/06513* (2013.01); *H01L 2225/06541* (2013.01); *H01L 2225/06565* (2013.01); *H01L 2225/06589* (2013.01); *H01L 2924/00014* (2013.01); *H01L 2924/1431* (2013.01); *H01L 2924/1432* (2013.01); *H01L 2924/1434* (2013.01); *H01L 2924/15311* (2013.01); *H05K 2201/10159* (2013.01)

(56) References Cited

U.S. PATENT DOCUMENTS

| | | |
|---|---|---|
| 9,368,479 B2 | 6/2016 | Katkar et al. |
| 2005/0104187 A1 | 5/2005 | Polsky et al. |
| 2008/0258293 A1 | 10/2008 | Yang et al. |
| 2012/0306082 A1* | 12/2012 | Sekar .................. H01L 23/3677 257/758 |
| 2015/0200149 A1 | 7/2015 | Zhao et al. |
| 2016/0260687 A1 | 9/2016 | Gao et al. |

* cited by examiner

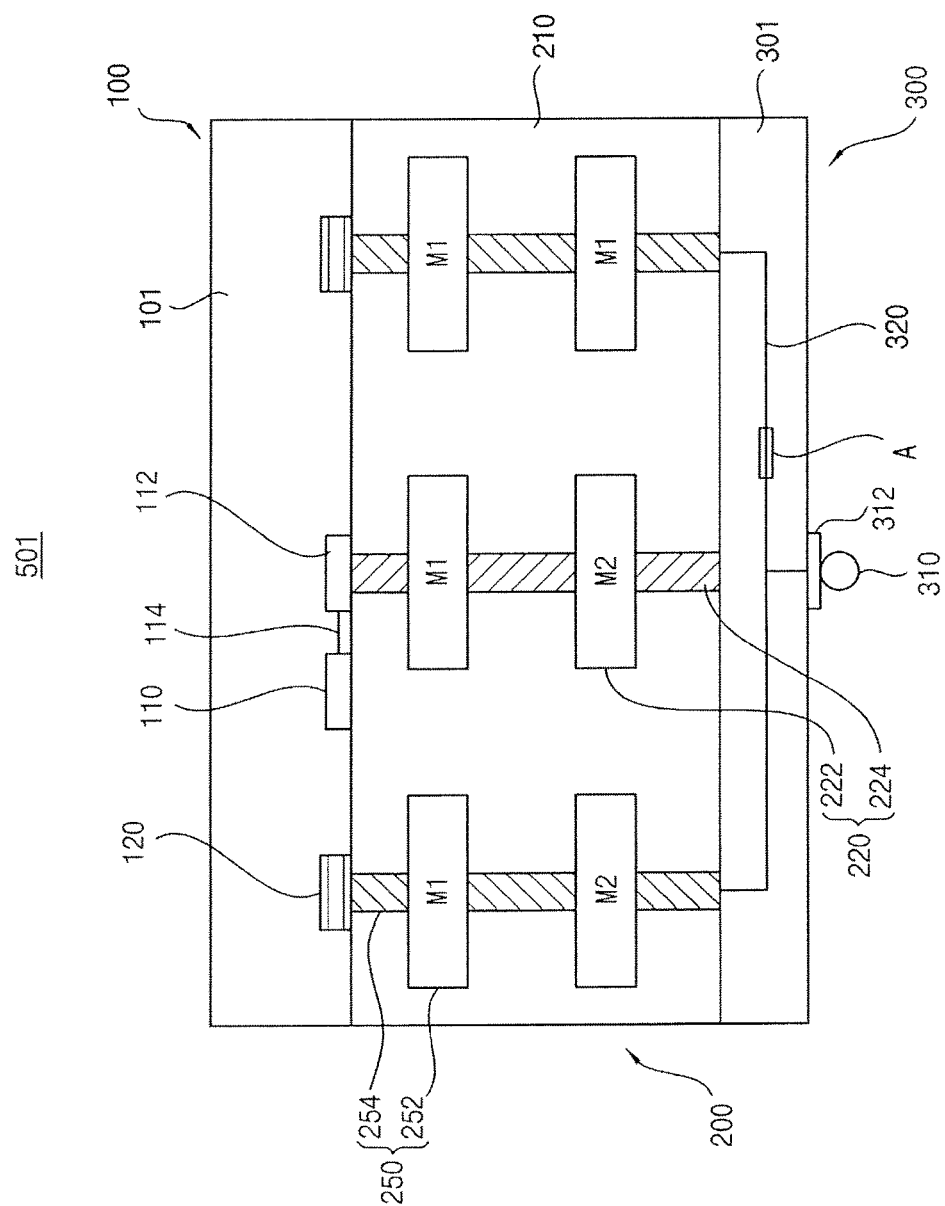

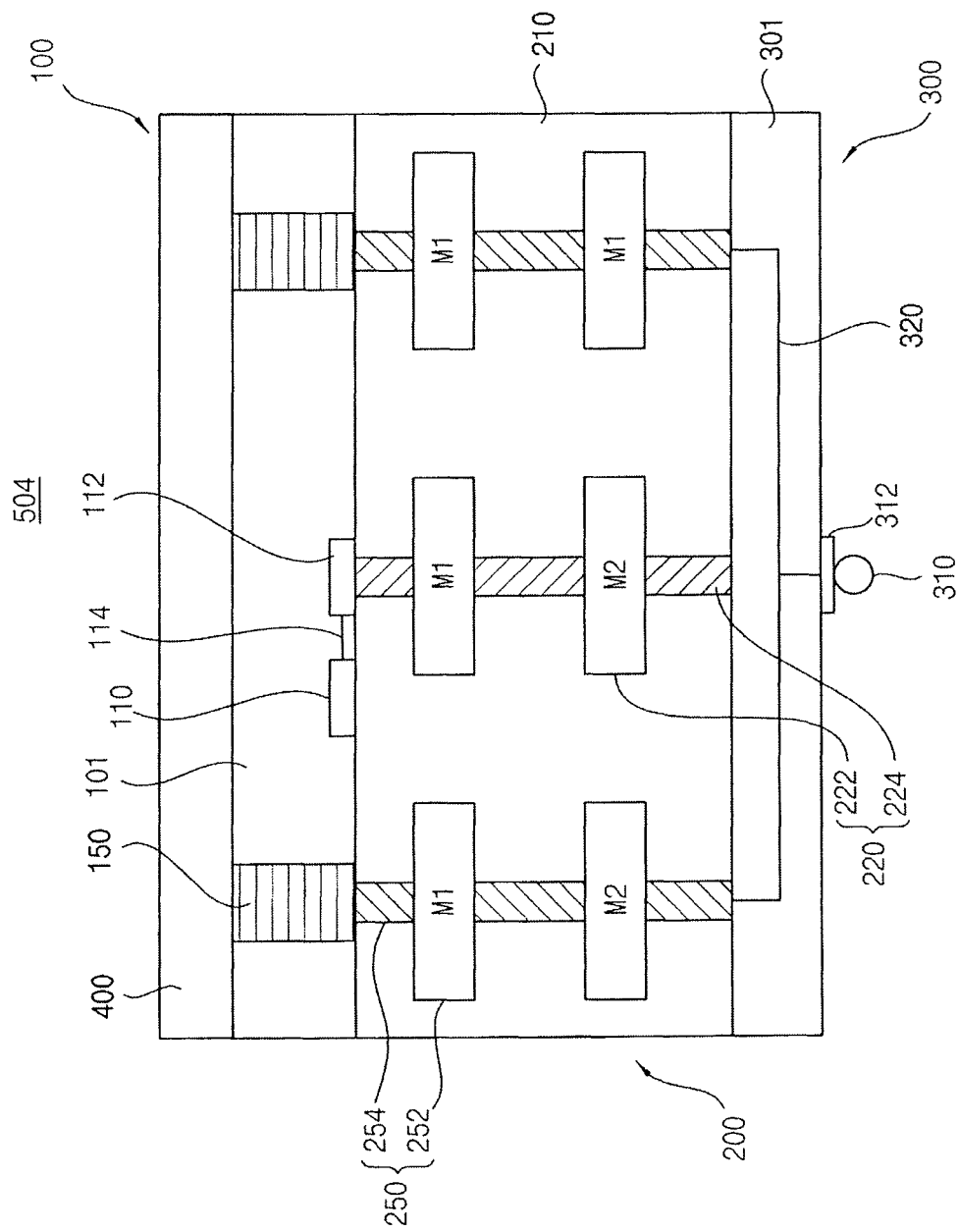

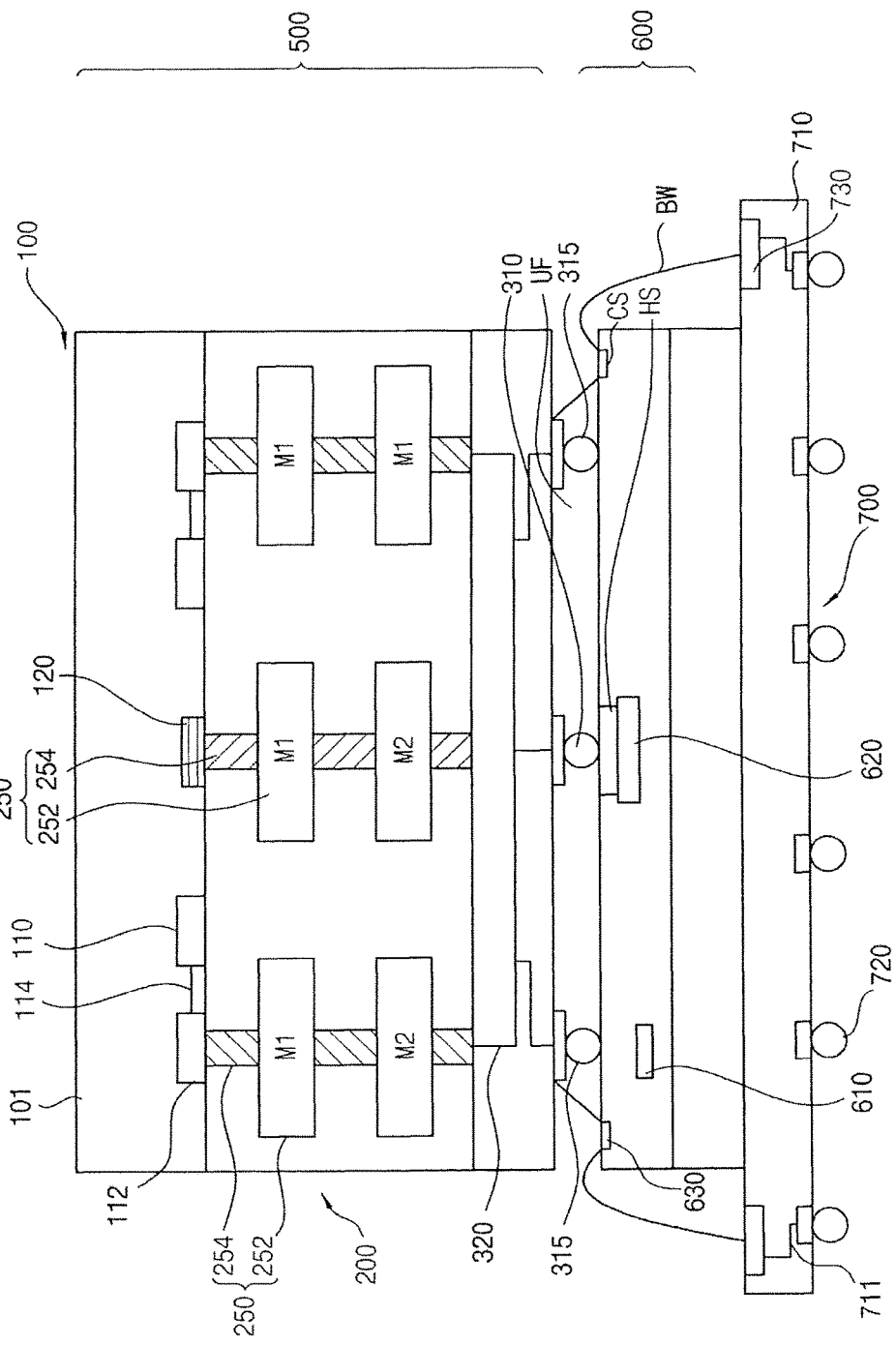

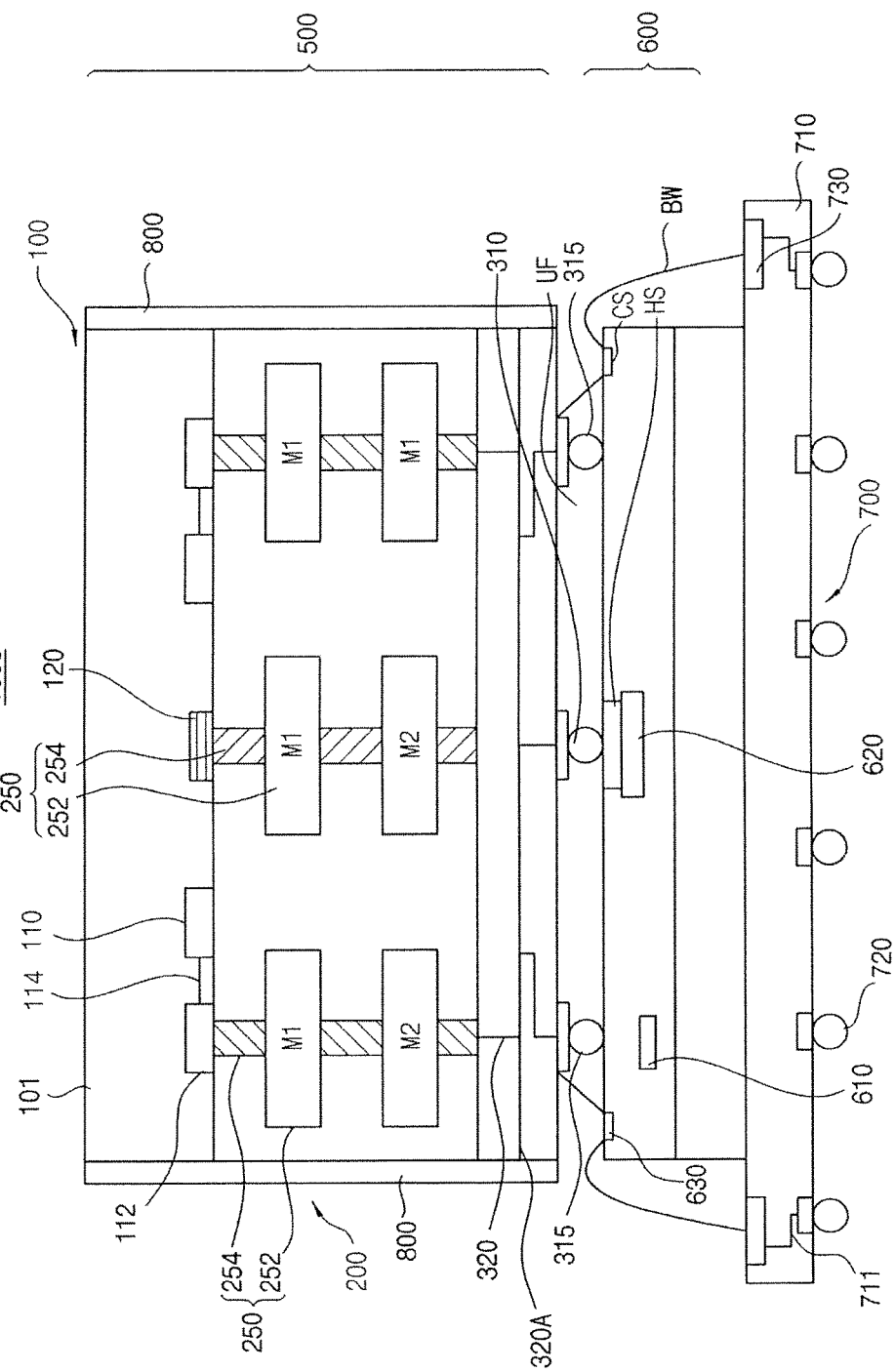

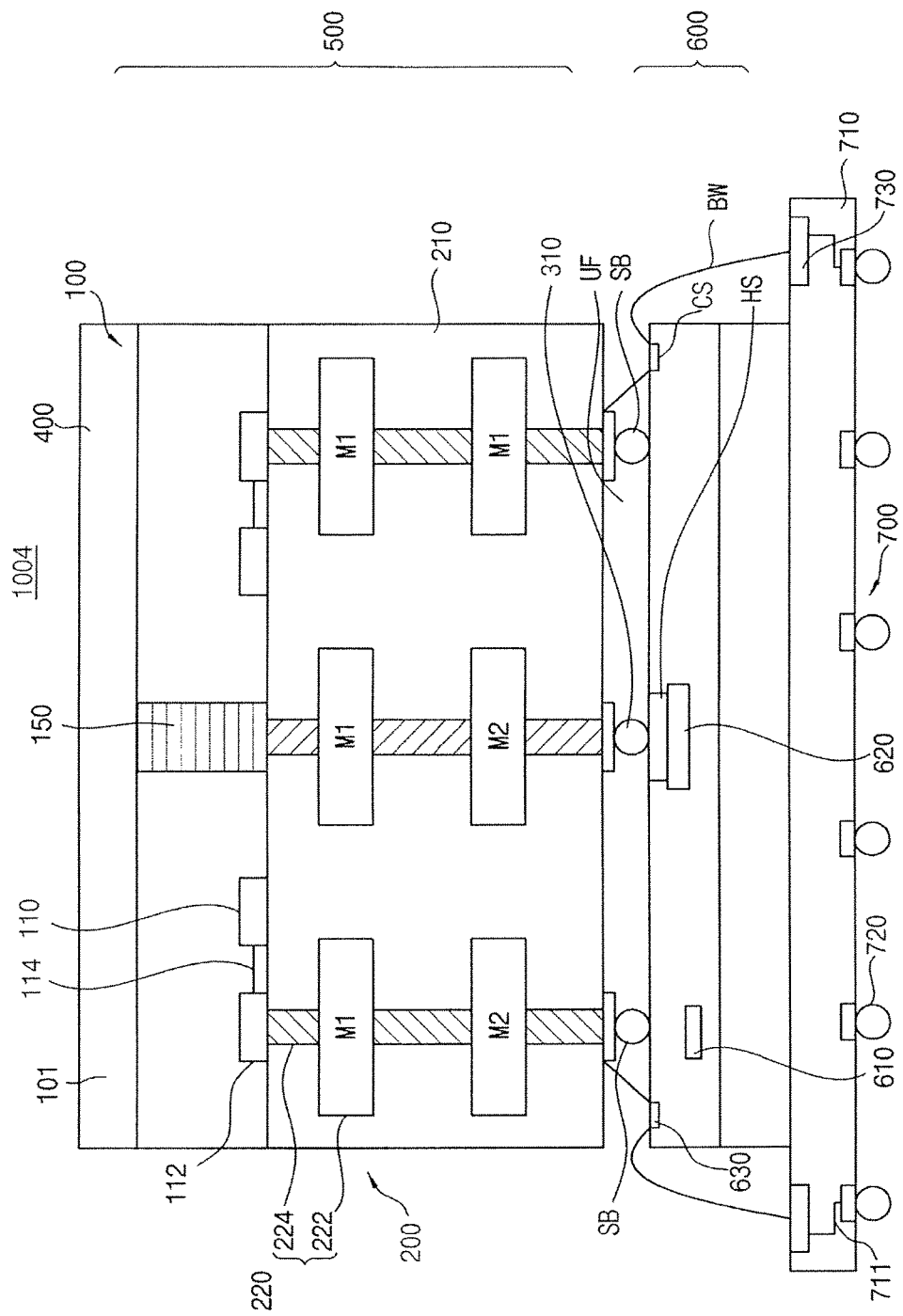

SEMICONDUCTOR MEMORY DEVICE AND A CHIP STACK PACKAGE HAVING THE SAME

CROSS-REFERENCE TO RELATED APPLICATION

This application claims priority under 35 U.S.C. § 119 to Korean Patent Application No. 10-2016-0172023, filed on Dec. 15, 2016, in the Korean Intellectual Property Office, the disclosure of which is incorporated by reference herein in its entirety.

TECHNICAL FIELD

The inventive concept relates to a semiconductor memory device, and more particularly, to a semiconductor memory device having a thermal dispersion circuit and a chip stack package having the same.

DISCUSSION OF THE RELATED ART

As small mobile devices such as smart phones and tablet personal computers (PCs) are becoming widely used, the demand for application processors (AP) is rapidly increasing. An AP may include a logic chip having a central processing unit (CPU), a digital signal processor (DSP) and/or a micro controller and at least one memory device for storing digital data combined into one semiconductor package.

Various additional chips may be added to the logic chip of the AP depending on the task and performance requirements of the AP. The operation heat of the AP may impact its performance.

Some of the chips included in the AP may generate more heat than others. Thus, a plurality of hot spots may exist in the AP.

For example, a graphic processing unit (GPU) may be included in an AP. However, the GPU may generate a large quantity of heat when performing the graphics-related operations. In other words, the GPU may function as a hot spot in the AP. Such a hot spot may cause operation failures of the AP, and possibly the shut-down of the mobile device in which it is disposed.

SUMMARY

According to an exemplary embodiment of the inventive concept, a semiconductor memory device includes an integrated circuit (IC) chip structure, wherein the IC chip includes a substrate, a memory cell disposed on the substrate, and a local well disposed on the substrate, wherein a conductivity type of the local well is different from a conductivity type of the substrate, a wiring stack structure disposed on the IC chip structure, wherein the wiring stack structure includes a signal transfer pattern connected to the memory cell through a signal interconnector, and a thermal dispersion pattern connected to the local well through a thermal interconnector, and a heat transfer structure connected to the thermal dispersion pattern for transferring heat to the thermal dispersion pattern from a heat source.

According to an exemplary embodiment of the inventive concept, a semiconductor memory device includes an IC chip structure, wherein the IC chip structure includes a substrate, and a memory cell disposed on the substrate, a wiring stack structure disposed on the IC chip structure, wherein the wiring stack structure includes a signal transfer pattern connected to the memory cell through a signal interconnector, and a thermal dispersion pattern connected to the semiconductor substrate through a thermal interconnector, wherein the signal interconnector transfers operating signals to the memory cell, a heat spreader disposed on the substrate and connected to the thermal dispersion pattern such that heat is dissipated from the thermal dispersion pattern through the heat spreader, and a heat transfer structure connected to the thermal dispersion pattern and transferring the heat from a heat source to the thermal dispersion pattern.

According to an exemplary embodiment of the inventive concept, a chip stack package includes a circuit board including at least one conductive pattern, a first die mounted on the circuit board, the first die including a first chip and at least one second chip that generates more heat than the first chip, wherein a portion of the first die that is heated from the at least one second chip is a hot spot, and a second die stacked on the first die and connected to the first die. The second die includes an IC chip structure on which data is stored, a wiring stack structure, the wiring stack structure including a signal transfer pattern connected to the IC chip structure for transferring operating signals to the IC chip structure, and a thermal dispersion pattern that disperses the heat from the hot spot, and a heat transfer structure for transferring the heat from the hot spot to the thermal dispersion pattern.

According to an exemplary embodiment of the inventive concept, a semiconductor memory device includes an IC chip structure, wherein the IC chip structure includes a substrate, a memory cell disposed on the substrate, and a local well disposed on the substrate, wherein a conductivity type of the local well is different from a conductivity type of the substrate, a wiring stack structure disposed on the IC chip structure, wherein the wiring stack structure includes a signal transfer pattern, a thermal dispersion pattern, a first insulation layer, and a second insulation layer stacked on the first insulation layer, wherein the signal transfer pattern includes a first metal pattern disposed on the first insulation layer, a second metal pattern disposed on the second insulation layer, and a signal interconnector connected to the memory cell and to the first and second metal patterns, wherein the thermal dispersion pattern includes a third metal pattern disposed on the first insulation layer, a fourth metal pattern disposed on the second insulation layer, and a thermal interconnector connected to the local well and to the third and fourth metal patterns, and a heat transfer structure connected to the thermal interconnector for transferring heat to the third and fourth metal patterns.

BRIEF DESCRIPTION OF THE DRAWINGS

The above and other features of the inventive concept will become more apparent by describing in detail exemplary embodiments thereof with reference to the accompanying drawings, in which:

FIG. 2A is a cross-sectional view illustrating a semiconductor memory device according to an exemplary embodiment of the inventive concept;

FIG. 4B is a cross-sectional view illustrating a semiconductor memory device according to an exemplary embodiment of the inventive concept;

FIG. 6 is a cross-sectional view illustrating a chip stack package having a semiconductor memory device, according to an exemplary embodiment of the inventive concept;

FIG. 7 is a cross-sectional view illustrating a chip stack package having a semiconductor memory device, according to an exemplary embodiment of the inventive concept; and FIG. 8 is a cross-sectional view illustrating a chip stack package having a semiconductor memory device, according to an exemplary embodiment of the inventive concept.

DETAILED DESCRIPTION OF THE EMBODIMENTS

Figure 1:
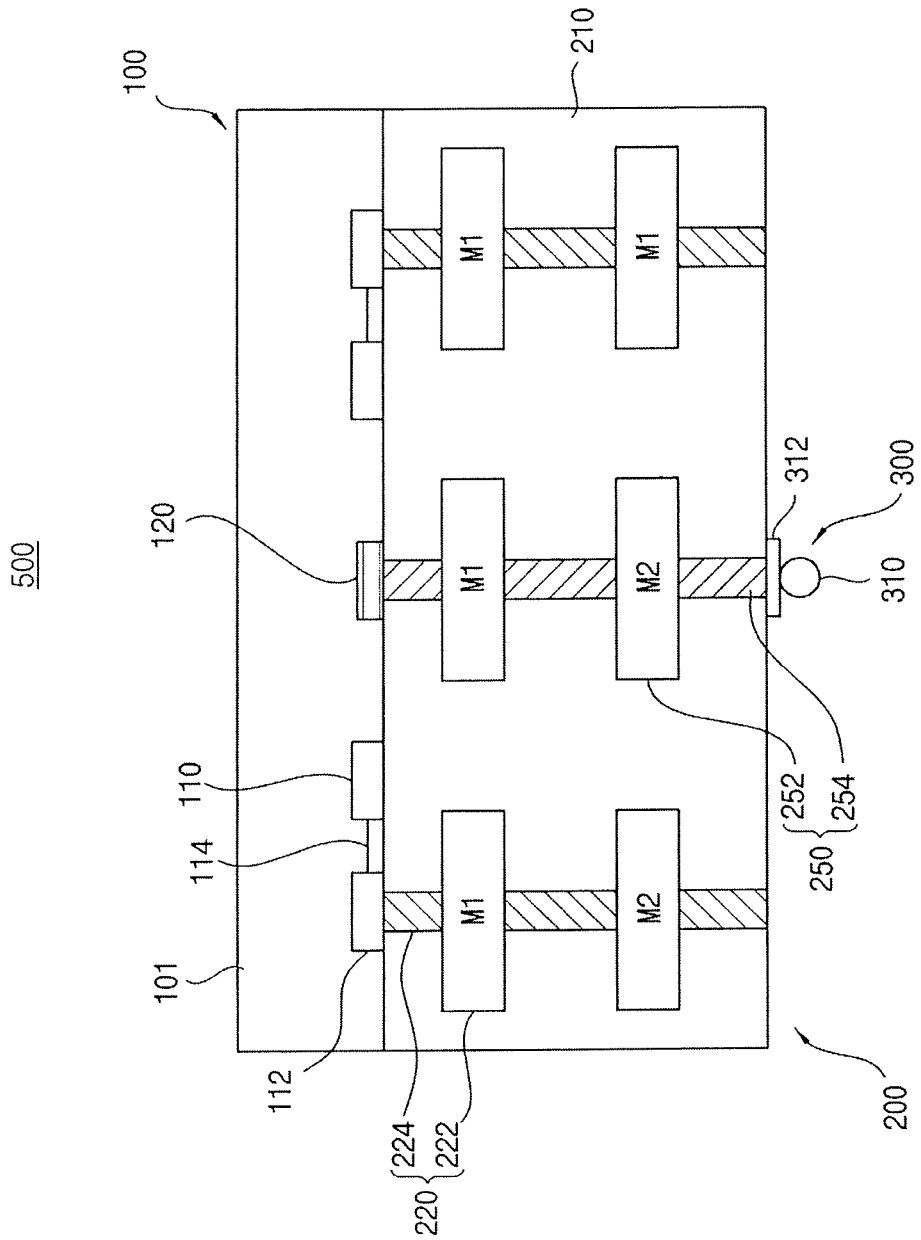
FIG. 1 is a cross-sectional view illustrating a semiconductor memory device according to an exemplary embodiment of the inventive concept.

Exemplary embodiments of the inventive concept will now be described more fully with reference to accompanying drawings. Like reference numerals may refer to like components throughout the specification.

FIG. 1 is a cross-sectional view illustrating a semiconductor memory device according to an exemplary embodiment of the inventive concept.

Referring to FIG. 1, a semiconductor memory device 500 may include an integrated circuit (IC) chip structure 100. The IC chip structure 100 may include a plurality of memory cells 110 on a substrate 101, a wiring stack structure 200 disposed on the IC chip structure 100 and for transferring operating signals to the memory cell 110, and a heat transfer structure 300 for transferring heat from a heat source. A plurality of local wells 120 may be disposed in the substrate 101 and may have a conductivity type that is different from a conductivity type of the substrate 101.

For example, the IC chip structure 100 may include a plurality of the memory cells 110 that may be disposed on the substrate 101 having a first conductivity type through a front end of line (FEOL) process.

The substrate 101 may include a semiconductor substrate such as a silicon (Si) substrate, a gallium-arsenic (Ga—As) substrate and a silicon-germanium (Si—Ge) substrate, and may have a conductivity type according to the electric conductivity of the dopants. For example, the substrate 101 may be a p-type substrate when positive dopants are doped into the substrate 101, and may be an n-type substrate when negative dopants are doped into the substrate 101. In addition, the substrate 101 may include a silicon-on-insulator (SOI) substrate in which a pair of p-type or n-type substrates may be separated from each other by an insulator. Various semiconductor board(s)/substrate(s) may be used as the substrate 101. For example, various semiconductor board(s)/substrate(s) that have p-type or n-type semiconductor characteristics may be used.

A gate structure having a gate insulation layer and a conductive layer stacked on the gate insulation layer may be formed on the substrate 101. An impurity may be implanted onto the substrate 101 around the gate structure to form a transistor. The transistor may have the gate structure and source and drain junction areas. In addition, a capacitor may be formed on the substrate 101 to correspond to each of the transistors. Thus, the memory cell 110 of the semiconductor memory device 500 may be formed. The memory cell 110 may be, for example, a dynamic random-access memory (DRAM) device. Alternatively, or additionally, the memory cell 110 may include a plurality of transistors on the substrate 101, and a unit memory block including a string selection transistor, a plurality of cell transistors and a ground selection transistor.

The memory cell 110 may be connected to the wiring stack structure 200 via a contact pad 112, which may be disposed on an active face of the substrate 101, and an interconnection structure 114. Thus, the memory cell 110 may be connected to another circuit through the wiring stack structure 200. For example, the interconnection structure 114 may include a drain plug contact with the drain junction area of the substrate 101 and a source plug contact with the source junction area of the substrate 101.

The number and configurations of the memory cells 110 may be varied according to the requirements and characteristics of the IC chip structure 100. For example, the memory cell 110 may be arranged on the substrate 101 as a center pad type or an edge pad type according to the relative position of the contact pads on the substrate 101.

A plurality of local wells 120 may be disposed on the active face of the substrate 101. The local wells 120 may be spaced apart from the memory cells 110 and may have a conductivity type that may be different from that of the substrate 101.

For example, some dopants having the conductivity type different from the conductivity type of the substrate 101 may be implanted onto some local areas of the active face of the substrate 101 after forming the memory cell 110. Thus, the local wells 120 may be electrically separated from the substrate 101. For example, when the memory cell 110 includes a p-type metal-oxide-semiconductor (PMOS) transistor, the local well 120 may include n-type dopants (an N well), and when the memory cell 110 includes an n-type metal-oxide-semiconductor (NMOS) transistor, the local well 120 may include p-type dopants (a P well).

The wiring stack structure 200 may be disposed on the IC chip structure 100. For example, the wiring stack structure 200 may include a metal stack structure that may be electrically insulated from the IC chip structure 100 by an insulation interlayer pattern 210. The metal stack structure may be formed by a back end of line (BEOL) process in which the wiring process and the insulation process may be repeated.

For example, the wiring stack structure 200 may include the insulation interlayer pattern 210 covering the IC chip structure 100, a signal transfer structure 220 connected to the contact pad 112 through the insulation interlayer pattern 210, and a thermal dispersion structure 250 connected to the local well 120 through the insulation interlayer pattern 210.

A first insulation interlayer may be formed on an active face of the substrate 101, which may include the contact pad 112 and the local well 120, and a first metal pattern M1 may be formed on the first insulation interlayer of the insulation interlayer pattern 210. The first metal pattern M1 may be connected to the contact pad 112 and the local well 120, through the first insulation interlayer of the insulation interlayer pattern 210, by an interconnector. A second insulation interlayer of the insulation interlayer pattern 210 may be formed on the first metal pattern M1, and a second metal pattern M2 may be formed on the second insulation interlayer of the insulation interlayer pattern 210. The second metal pattern M2 may be connected to the first metal pattern M1, through the second insulation interlayer of the insulation interlayer pattern 210, by an interconnector. A third insulation interlayer of the insulation interlayer pattern 210 may be formed on the second metal pattern M2, and an interconnector may be formed through the third insulation interlayer of the insulation interlayer pattern 210. Therefore, the wiring stack structure 200 may include a plurality of metal pattern layers that may be stacked upward on the active face of the substrate 101. The metal pattern layers may be separated from each other by the insulation interlayer pattern 210. The interconnectors connecting the first metal pattern M1 to the second metal pattern M2 include a heat-conducting material, for example, a metal. In addition, as shown in FIG. 1, a first metal pattern M1, connected to either the contact pad 112 or the local well 120, may overlap a corresponding second metal pattern M2.

While the present exemplary embodiment of the inventive concept discloses that the wiring stack structure 200 includes a 2-story metal stack pattern (e.g., the second metal pattern M2 stacked on the first metal pattern M1), the wiring stack structure 200 may include a 3 or more story metal stack pattern, according to the memory characteristics of the semiconductor memory device 500.

The metal pattern and the interconnector making contact with the contact pad 112 may be the signal transfer structure 220 for transferring operating signals to the memory cells 110, and the metal pattern and the interconnector making contact with the local well 120 may be the thermal dispersion structure 250 for dispersing heat from a heat source.

In an exemplary embodiment of the inventive concept, the signal transfer structure 220 may include a signal transfer pattern 222, such as a metal wiring pattern for transferring the operating signals, and a signal interconnector 224, connected to the signal transfer pattern 222. The thermal dispersion structure 250 may include a thermal dispersion pattern 252 for transferring and dissipating heat from the heat source, and a thermal interconnector 254 connected to the thermal dispersion pattern 252.

The signal transfer pattern 222 and the thermal dispersion pattern 252 may be formed on the same insulation interlayer by using the same metal patterning process so that each story (or layer) of the signal transfer pattern 222 and the thermal dispersion pattern 252 may be disposed on the same story of the insulation interlayer pattern 210 and may include the same materials. The signal interconnector 224 and the thermal interconnector 254 may be simultaneously formed during the same process and may include the same materials.

In an exemplary embodiment of the inventive concept, the signal transfer pattern 222 and the thermal dispersion pattern 252 may include the same conductive metal pattern, and the signal interconnector 224 and the thermal interconnector 254 may include the same conductive via structure.

The signal transfer structure 220 may be connected to the contact pad 112 to transfer operating signals to the memory cell 110 or to transfer data signals from the memory cell 110. For example, the signal transfer structure 220 may transfer a data access signal for reading/programming data from/to the memory cell 110, a power signal for applying a driving power to the memory cell 110 and a ground signal for electrically grounding the memory cell 110. The thermal dispersion structure 250 may be connected to the local well 120. Alternatively, or additionally, the heat transfer structure 300 may transfer heat generated from a heat source. For example, the transfer structure 300 may transfer super heat (e.g., heat above a certain temperature) from a hot spot to disperse and store the super heat into the thermal dispersion structure 250. Thus, the thermal dispersion structure 250 may function as a heat path or a temporary heat sink for dissipating the super heat from the hot spot, and the thermal dispersion structure 250 may be electrically separated from the IC chip structure 100.

Therefore, although the heat source or the hot spot and the IC chip structure 100 may be driven by the same power source, the heat generated from the heat source or the hot spot may be sufficiently dispersed and/or dissipated without any deterioration to the IC chip structure 100 caused by signal interferences and noises.

In addition, when the memory device 500 is combined with other devices, such as a logic device having a hot spot, to form a chip stack package, the super heat generated from the hot spot may be sufficiently dispersed from the logic device without any additional processes for thermal dissipation. This is because the thermal dispersion structure 250 may be formed on the substrate 101 simultaneously with the signal transfer structure 220 by using the same metal patterning process. Accordingly, the thermal dispersion structure 250 may be used to reduce or prevent heat damage to the chip stack package including the memory device 500 and a logic device by absorbing and dissipating the super heat from the logic device.

As will be described in detail below, the heat generated from the logic device may be dispersed into the thermal dispersion structure 250 and may be selectively dissipated outwards (or away from the logic device) by a heat spreader that may be provided with the memory device 500.

The heat transfer structure 300 may be disposed under the wiring stack structure 200 and may be in contact with a heat source such that the heat generated from the heat source may be transferred to the thermal dispersion structure 250 through the heat transfer structure 300.

A passivation layer may be formed on the wiring stack structure 200. A contact terminal making contact with the signal transfer structure 220, and the heat transfer structure 300 making contact with the thermal dispersion structure 250, may be formed on the passivation layer.

The contact terminal and the heat transfer structure 300 may have various configurations and structures according to the structures and characteristics of external contact terminals of the memory device 500. When the memory device 500 is combined with a logic device having a hot spot, such as a graphics processing unit (GPU), the memory device 500 may be combined with the logic device in a flip chip structure. A bump structure such as a solder bump and/or a micro bump may be utilized as a contact terminal and as the heat transfer structure 300. Thus, the memory device 500 and the logic device may be electrically and thermally combined with each other with a high mechanical stability.

In an exemplary embodiment of the inventive concept, the heat transfer structure 300 may include at least one heat bump 310 making contact with the thermal dispersion structure 250.

For example, the thermal dispersion structure 250 may include a bump pad 312 making contact with an uppermost thermal interconnector 254 and a heat bump 310 that may be in contact with the bump pad 312 by a reflow process.

The heat bump 310 may be disposed on the passivation layer to correspond to the position of the hot spot of the logic device combined with the memory device 500 so that the heat bump 310 may be contact with the hot spot of the logic in the chip stack package. Therefore, the position of the heat bump 310 may be varied according to the package configuration of the memory device 500 and the logic device having the hot spot, the position of the hot spot in the logic device, and the arrangement of the thermal dispersion structure 250 of the memory device 500.

The memory device 500 may be combined with various other devices that include a hot spot, such as a logic device. The memory device 500 may be manufactured into various semiconductor packages. In a semiconductor package, the super heat generated from the hot spot may be sufficiently dispersed into the thermal dispersion structure 250 of the memory device 500.

In a semiconductor package including the memory device 500, the operating signals may be transferred to the IC chip structure 100 through the contact terminal, and the super heat generated from the hot spot may be transferred to the thermal dispersion structure 250 through the heat bump 310. The heat dispersed in the thermal dispersion structure 250 may be further dissipated outwards by a heat spreader, as described below. Therefore, the semiconductor package may be sufficiently prevented from thermal damages caused by the super heat.

The thermal dispersion structure 250 may be connected to a local well 120 of which the conductivity type may be different from that of the substrate 101, so the thermal dispersion structure 250 may be electrically separated from the IC chip structure 100. Thus, the memory cell 110 may be sufficiently protected from the signal interferences and noises when the logic device and the memory device 500 may be operated by the same power source.

In addition, the thermal dispersion structure 250 may be formed simultaneously with the signal transfer structure 220 in the same process. Thus no additional process may be required to manufacture the thermal dispersion structure 250 for dissipating the super heat from the hot spot of the logic device.

The heat transfer structure 300 may be variously modified for removing the limitations of the positions of the thermal dispersion structure 250 and the hot spot. For example, a re-directional layer structure may be provided with the memory device 500 under the wiring stack structure 200 so the thermal dispersion structure 250 may be disposed at a certain location irrespective of the position or arrangements of the hot spot of the logic device.

Figure 2B:
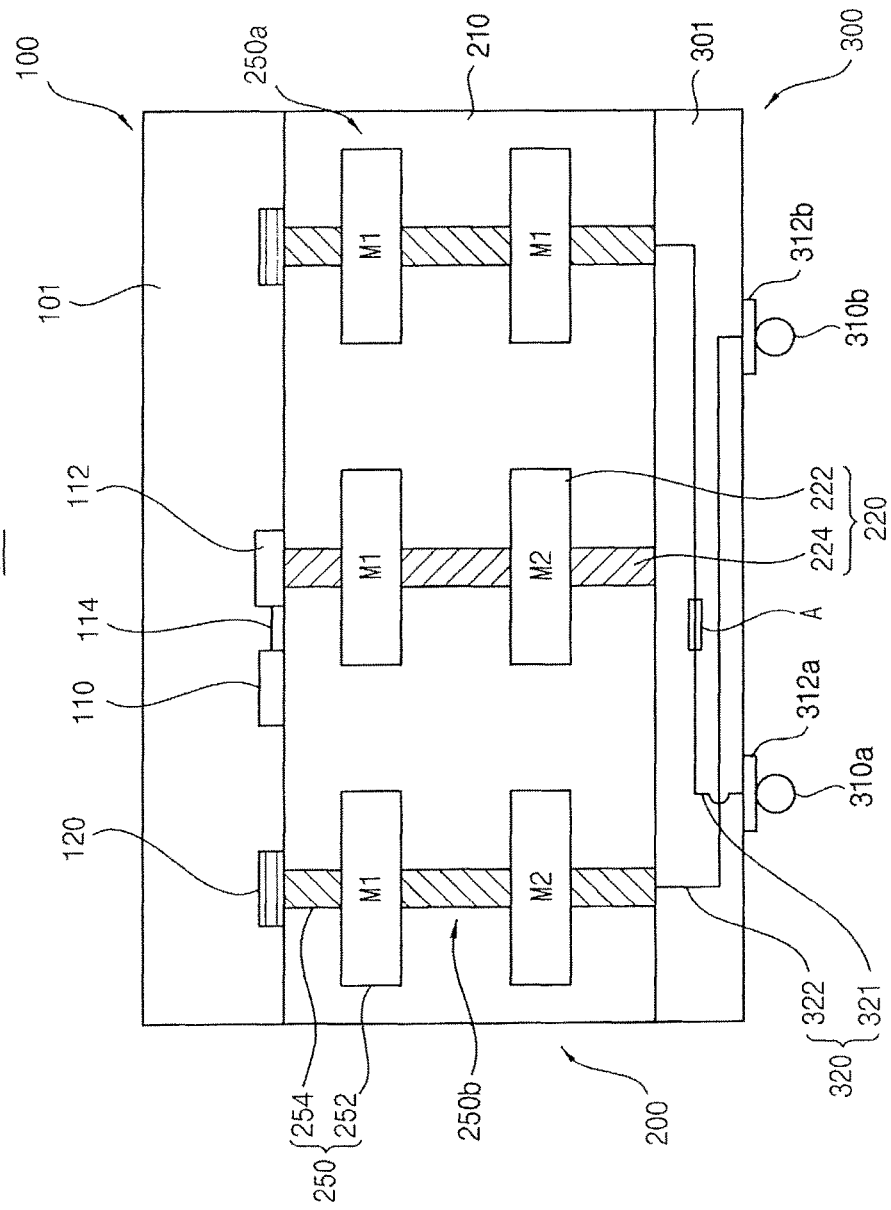
FIG. 2B is a cross-sectional view illustrating a semiconductor memory device according to an exemplary embodiment of the inventive concept.

FIG. 2A is a cross-sectional view illustrating a semiconductor memory device according to an exemplary embodiment of the inventive concept. FIG. 2B is a cross-sectional view illustrating a semiconductor memory device according to an exemplary embodiment of the inventive concept. The semiconductor memory devices 501 and 502 respectively illustrated in FIGS. 2A and 2B may be substantially similar to the semiconductor memory device 500 shown in FIG. 1 except for the heat transfer structure for connecting the thermal dispersion structure with the hot spot. Elements that are not described in FIGS. 2A and 2B may be assumed to be identical or substantially identical to corresponding elements described with reference to FIG. 1.

Referring to FIG. 2A, the semiconductor memory device 501 may include a heat transfer structure 300 having a heat bump 310 and a heat transfer circuit 320.

An insulating capping layer may be formed on the wiring stack structure 200, and a path line interconnecting the heat bump 310 and a thermal dispersion structure 250 may be disposed in the insulating capping layer. For example, a via hole and a trench may be formed in the insulating capping layer by a patterning process such that the thermal dispersion structure 250 and the heat bump 310 may be connected with each other. The via hole and the trench may be filled up with conductive materials to form a heat transfer line in the via hole and the trench. Thus, the heat transfer circuit may be disposed between the thermal dispersion structure 250 and the heat bump 310 under the wiring stack structure 200.

When an external device having a hot spot, such as the logic device, is combined with the semiconductor memory device 501 to form a semiconductor package, the semiconductor memory device 501 and the external device may be combined with each other irrespective of the positions of the hot spot and the thermal dispersion structure 250. Thus, a degree of freedom (DOF) of the device combination in the semiconductor package may be increased.

Thus, although the semiconductor memory device 501 may be provided as a center pad type, the thermal dispersion structure 250 may be disposed at an edge portion of the substrate 101, and the hot spot may be disposed at a central portion of the external device, the thermal dispersion structure 250 and the hot spot of the external device may be connected with each other by the heat transfer circuit 320 such that heat from the hot spot is transferred to the thermal dispersion structure(s) 250 through the heat transfer circuit 320.

Referring to FIG. 2B, the semiconductor memory device 502 may include a heat transfer structure 300 having a heat bump 310 (or 310a and 310b, described below) and a stacked layered heat transfer circuit 320.

In an exemplary embodiment of the inventive concept, first and second insulating capping layers may be formed on the wiring stack structure 200, and a plurality of stacked path lines interconnecting a plurality of the heat bumps 310a and 310b and a plurality of the thermal dispersion structures 250a and 250b, respectively, may be disposed in each insulating capping layer. Thus, a plurality of hot spots of the external device may be individually connected to the respective thermal dispersion structures 250 of the semiconductor memory device 502.

For example, the first insulating capping layer may be formed into a first capping pattern having a via hole and a trench by a patterning process such that the first thermal dispersion structure 250a and the first heat bump 310a may be connected with each other. The via hole and the trench may be filled up with conductive materials to form a first heat transfer line 321 in the via hole and the trench of the first capping pattern. Then, the second insulating capping layer may be formed on the first capping pattern such that the first heat transfer line 321 may be covered with the second capping layer. The second capping layer may be formed into a second capping pattern having another via hole and another trench by a patterning process such that the second thermal dispersion structure 250b and the second heat bump 310b may be connected with each other. The other via hole and the other trench may be filled up with conductive materials to form a second heat transfer line 322 in the via hole and the trench of the second capping pattern. Therefore, the first heat transfer line 321 and the second heat transfer line 322 may be vertically stacked under the wiring stack structure 200 and be separated from each other by a stacked capping pattern 301.

The heat transfer lines 321 and 322 may be partially broken to prevent an interference with signal lines in the stacked capping pattern 301. In this case, the heat transfer circuit 320 may further include a bridge line for connecting a pair of the neighboring broken portion of the heat transfer line and a bridge via for connecting the bridge line and the broken heat transfer line.

Figure 3:
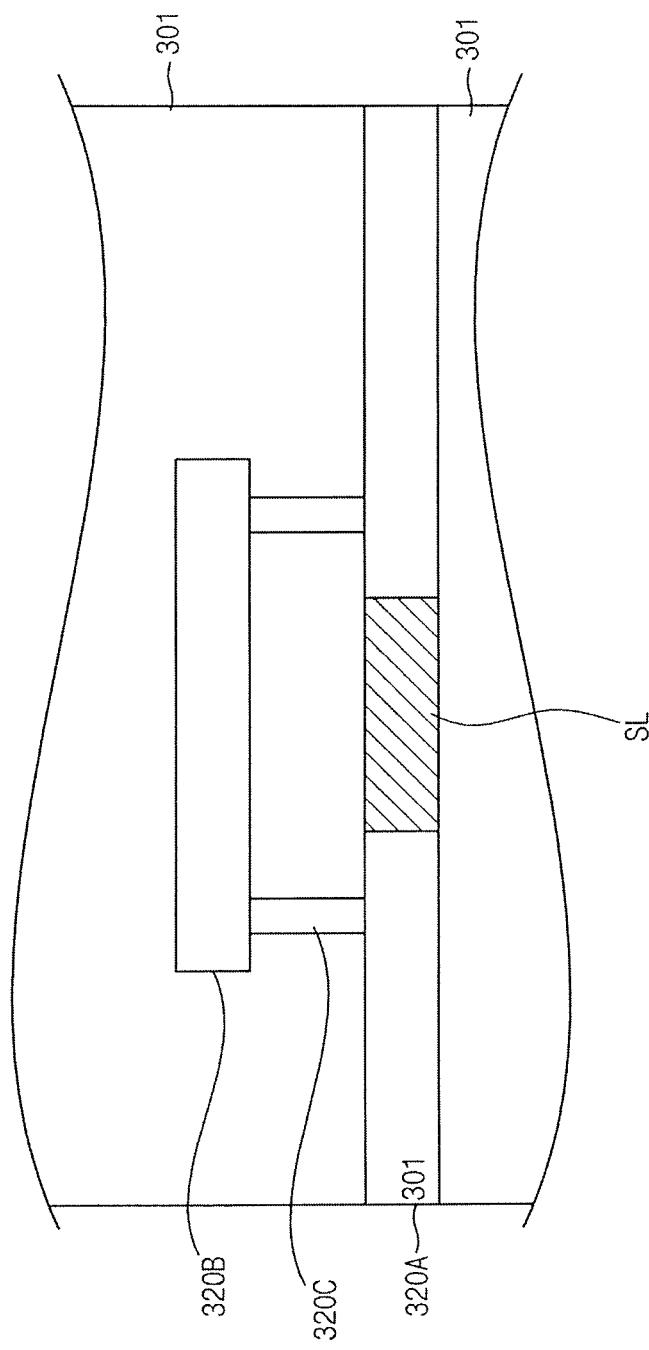
FIG. 3 is an enlarged view illustrating a portion "A" of a heat transfer circuit shown in FIGS. 2A and 2B, according to an exemplary embodiment of the inventive concept.

FIG. 3 is an enlarged view illustrating a portion "A" of the heat transfer circuit shown in FIGS. 2A and 2B, according to an exemplary embodiment of the inventive concept.

Referring to FIG. 3, the heat transfer circuit 320 may be partially broken by a signal line SL through which operating signals may be transferred to the signal transfer structure 220. For example, the heat transfer line may be broken into a pair of broken lines 320A such that the signal line SL may be interposed between the pair of the broken lines 320A. A bridge line 320B may be disposed around the signal line SL. A bridge via 320C may be disposed between each bridge line 320B and its respective broken line 320A.

When the signal line SL and the heat transfer line may cross each other in the capping pattern 301, the heat transfer line may be broken into the broken lines 320A to prevent any damages to the signal line SL. Then, the broken lines 320A may be connected with each other by the bridge line 320B and the bridge vias 320C. Therefore, the heat transfer circuit 320 may be connected with the thermal dispersion structure 250 and the heat bumps 310 without any interference with the signal lines SL.

When the semiconductor memory device 502 is combined with an external device having a hot spot to form a semiconductor package, the super heat generated from the hot spot when operating the semiconductor package may be sufficiently dispersed into the thermal dispersion structure(s) 250 of the semiconductor memory device 502. Therefore, the semiconductor package having the semiconductor memory device 502 may not be subjected to damage from the super heat of the hot spot.

The heat in the thermal dispersion structure 250 may be dissipated outwards by various thermal dissipation members described below.

Figure 4A:
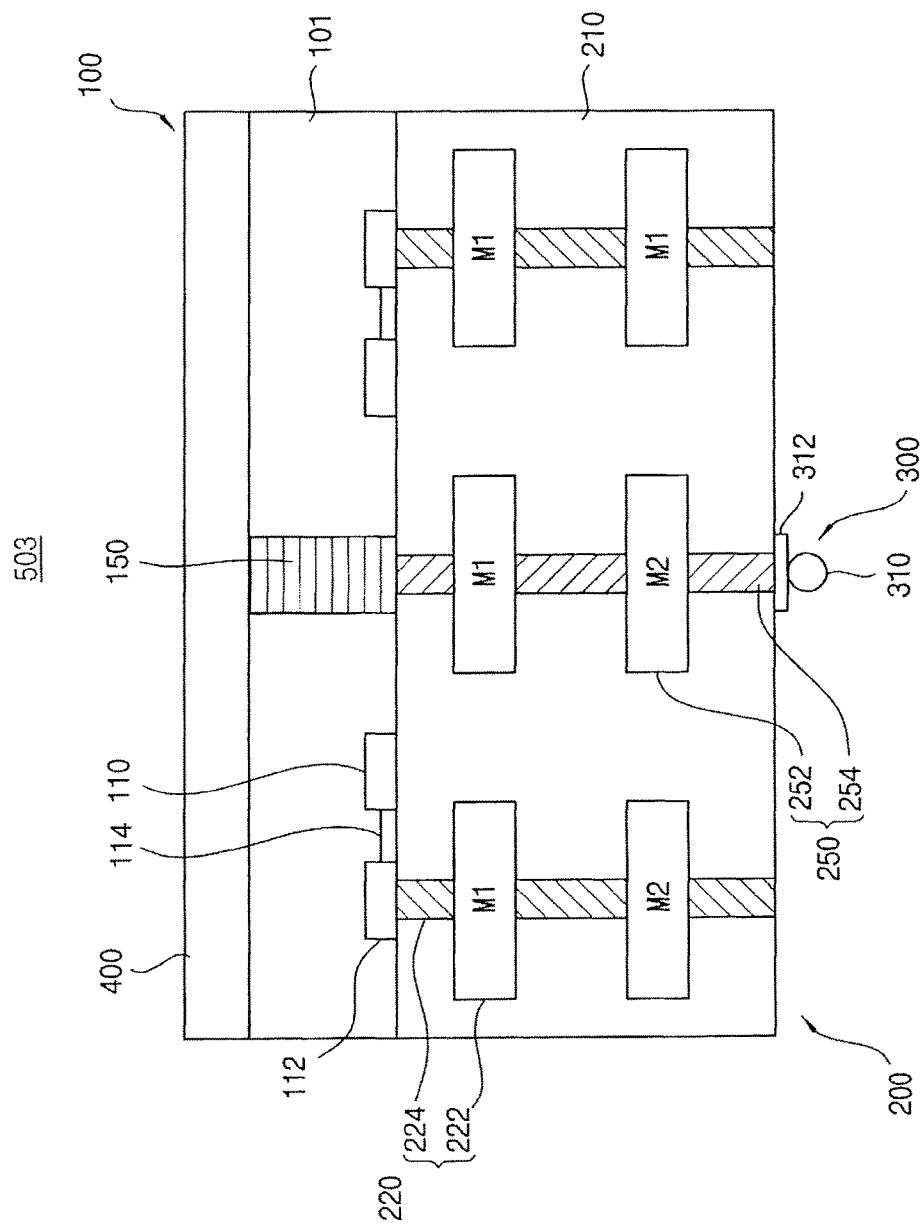
FIG. 4A is a cross-sectional view illustrating a semiconductor memory device according to an exemplary embodiment of the inventive concept.

FIG. 4A is a cross-sectional view illustrating a semiconductor memory device according to an exemplary embodiment of the inventive concept. FIG. 4B is a cross-sectional view illustrating a semiconductor memory device according to an exemplary embodiment of the inventive concept. The semiconductor memory device 503 illustrated in FIG. 4A may be substantially similar to the semiconductor memory device 500 shown in FIG. 1, except that the local well 120 may be connected with a thermal column or may be replaced by the thermal column. The semiconductor memory device 504 illustrated in FIG. 4B may be substantially similar to the semiconductor memory device 501 shown in FIG. 2A, except that the local well 120 may be connected with a thermal column or may be replaced by the thermal column. The thermal column may be connected with a heat spreader for dissipating heat outwards from the thermal dispersion structure 250.

Referring to FIG. 4A, the semiconductor memory device 503 may include a heat spreader 400 that may be connected to the thermal dispersion structure 250, so the heat may be dissipated out of the semiconductor memory device 503 from the thermal dispersion structure 250. Accordingly, the super heat generated from the hot spot of the external device may be dispersed into the thermal dispersion structure 250 and may be dissipated outwards by a heat spreader 400.

For example, the heat spreader 400 may be disposed on a rear surface of the substrate 101 and may be adhered to the substrate 101 by a heat-resistive adhesive. The heat spreader 400 may include a thermal conductive film that may be coated on the rear surface of the substrate 101. Alternatively, or additionally, the heat spreader 400 may include an air cooler or a water cooler that may be disposed on the rear surface of the substrate 101.

In an exemplary embodiment of the inventive concept, the heat spreader 400 may include a dissipating plate that may be adhered to the substrate 101 by using the heat-resistive adhesive. The dissipating plate may have a coefficient of thermal expansion and a young's modulus that may be similar to those of the substrate 101. The dissipating plate may have a thermal conductivity that is higher than that of the heat-resistive adhesive to reduce warping of the substrate 101 by the super heat generated from the hot spot and by the heat generated from the operation of the IC chip structure 100.

The heat-resistive adhesive may include thermal interference materials in which an epoxy resin, a hardener and fillers for a heat transfer may be mixed up.

A heat column 150 may penetrate through the substrate 101 in such a way that the heat spreader 400 may be directly contact with the thermal dispersion structure 250 and the super heat may be directly transferred to the heat spreader 400 from the thermal dispersion structure 250.

For example, the heat column 150 may include a through-silicon thermal via that may be connected with the heat spreader 400 and the thermal dispersion structure 250 through the substrate 101. The through-silicon thermal via may include a metal having high thermal conductivity such as copper (Cu) and aluminum (Al).

Therefore, the super heat generated from the hot spot of the external device may be dispersed into thermal dispersion structure 250 through the heat bump 310 and may be dissipated out of the semiconductor memory device 503 through the heat spreader 400. Accordingly, the semiconductor package having the semiconductor memory device 503 and the external device having a hot spot may not be subject to damage by the super heat.

Since the thermal dispersion structure 250 may be provided with the semiconductor memory device 503 together with the signal transfer structure 220, no further additional processes may be needed to manufacture the thermal dispersion structure 250. Thus, the super heat may be rapidly dissipated out of the semiconductor package through the thermal dispersion structure 250 and the heat spreader 400 without any additional manufacturing processes.

Referring to FIG. 4B, the semiconductor memory device 504 may include a heat spreader 400 that may be connected to the thermal dispersion structure 250 and the heat transfer structure 300 having the heat bump 310 and the heat transfer circuit 320. The heat bump 310 and the heat transfer circuit 320 may have the same structures as the heat bump and the heat transfer circuit of the semiconductor memory device 502, so any further detailed descriptions on the heat bump 310 and the heat transfer circuit 320 will be omitted.

A plurality of the heat columns 150 may be disposed at an edge portion of the substrate 101 and may be connected to the thermal dispersion structures 250, respectively, through the substrate 101. The heat column 150 may be connected to the heat dispersion structure 250 one by one at the edge portion of the substrate 101. The heat may be dissipated out of the semiconductor memory device 504 from the thermal dispersion structure 250.

Accordingly, the super heat generated from the hot spot of the external device may be dispersed into the thermal dispersion structure 250 and may be dissipated out of the semiconductor package by the heat spreader 400 without any additional manufacturing processes.

The semiconductor memory device 504 and the external device having the hot spot may be combined with each other irrespective of the positions of the hot spot and the thermal dispersion structure 250, which may increase the DOF of the device combination in the semiconductor package.

Figure 5:
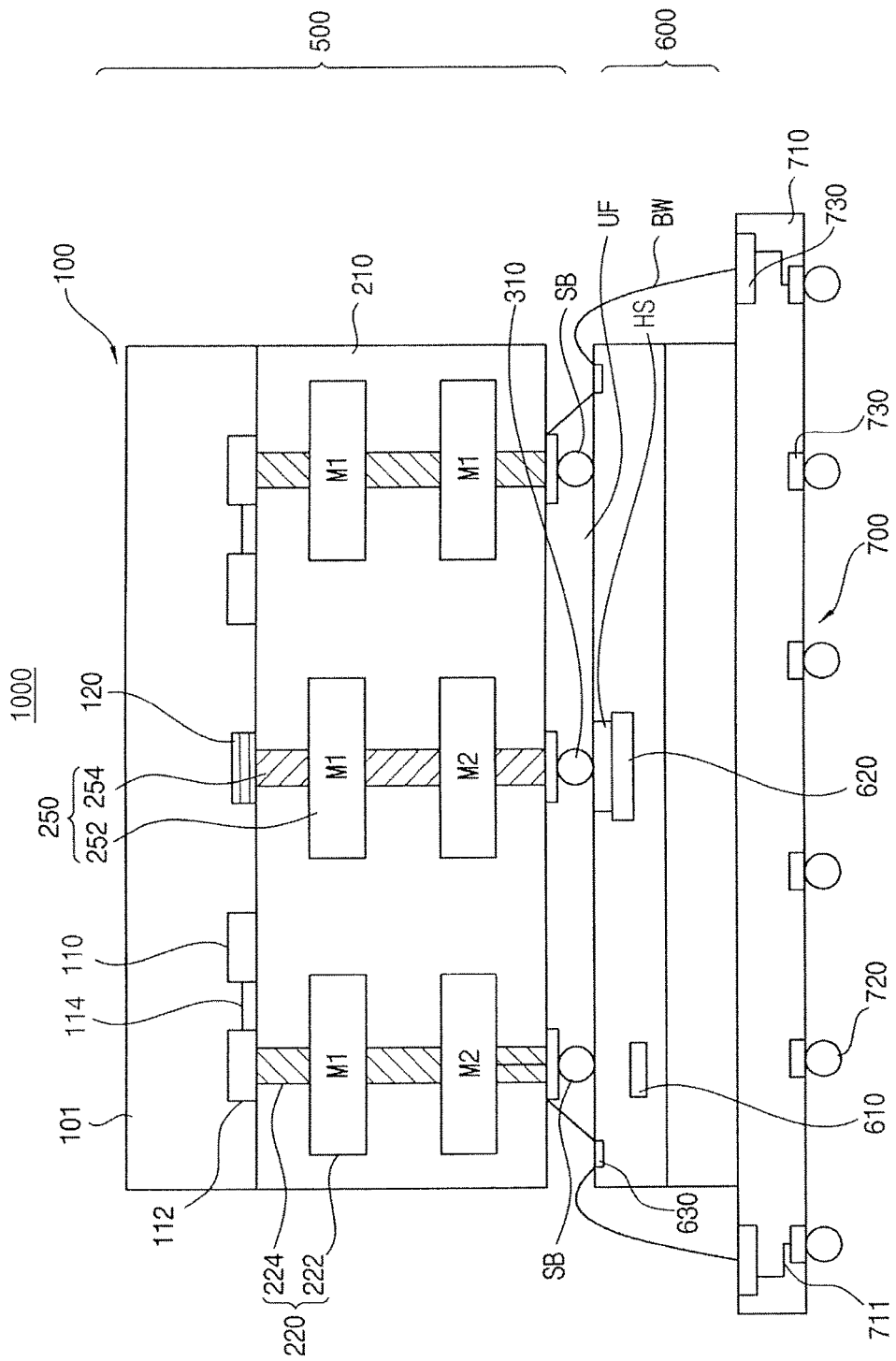
FIG. 5 is a cross-sectional view illustrating a chip stack package having the semiconductor memory device of FIG. 1, according to an exemplary embodiment of the inventive concept.

FIG. 5 is a cross-sectional view illustrating a chip stack package having the semiconductor memory device of FIG. 1, according to an exemplary embodiment of the inventive concept.

Referring to FIG. 5, a chip stack package 1000, in accordance with an exemplary embodiment of the inventive concept, may include a circuit board 700 having an internal electric circuit pattern 711, a first die 600 mounted on the circuit board 700 and a second die 500 stacked on and connected to the first die 600. The first die 600 may include a logic chip 610 and at least one functional chip 620 from which relatively more heat may be generated as a super heat, so the first die 600 may have a hot spot HS having a relatively high temperature at a location corresponding to the functional chip 620. The second die 500 may include an IC chip structure 100 on which digital data may be stored, a wiring structure 200 having a signal transfer structure 220 for transferring operating signals to the IC chip structure 100, a thermal dispersion structure 250 that may disperse the super heat from the hot spot HS to decrease the temperature of the hot spot HS, and a heat transfer structure 300 transferring the super heat to the thermal dispersion structure 250 from the hot spot HS of the first die 600.

For example, the circuit board 700 may include a plate body 710 having an insulating and heat resisting material with sufficient rigidity and a plurality of internal circuit patterns 711. The circuit patterns 711 may be connected to bonding pads 730 that may be disposed on upper and lower surfaces of the plate body 710, so the first die 600 and an external electronic system may be connected with each other via the bonding pad 730 and the internal circuit pattern 711. The bonding pad 730 on the upper surface of the plate body 710 may be in contact with the first die 600 and the bonding pad 730 on the lower surface of the plate body 710 may be contact with a contact terminal 720. The contact terminal 720 may be connected to the external electronic system. For example, the contact terminal may include a plurality of solder balls.

The plate body 710 may include a thermosetting plastic such as an epoxy resin, a polyimide, or a plate coated with a heat resisting organic film such as a liquid crystal polyester film and a polyamide film. The internal circuit pattern 711 may include a plurality of conductive lines or wirings that may be disposed in the plate body 710, and may include a power line for supplying an electric power, a plurality of signal lines for communicating data signals and a ground line for electrically grounding the signal lines and the power line. The conductive lines or the wirings of the circuit pattern 711 may be electrically insulated from one another by insulation layers. The circuit board 700 may include a printed circuit board (PCB) in which the circuit patterns 711 may be formed by using a printing process.

For example, the first die 600 may include an active device from which operational heat may be generated. An external power may be applied to the active device. Thus, various electronic operations may occur in the active device. As a result of the electronic operations, operational heat may be generated from the active device.

The first die 600 may include a plurality of conductive structures that may be stacked on a semiconductor substrate such as a silicon wafer and may be electrically separated from one another by a plurality of insulation interlayer patterns, and a plurality of wiring structures that may be connected to the conductive structures through the insulation interlayer patterns.

The conductive structures may include a logic chip 610 for controlling the external electronic system that may be combined with the chip stack package 1000. For example, a central processing unit (CPU), a digital signal processor (DSP) and a micro controller may be provided as the logic chip 610 to control the operation of the external electronic system.

The wiring structure may include a metal plug that may be connected to the conductive structure by penetrating through the insulation interlayer pattern and a metal wiring that may be contact with the metal plug. The metal wiring may include a signal line for transferring communication signals with the conductive structures, a power line for applying an electric power to the conductive structures and a ground line for electrically grounding the conductive structures.

Various functional chips 620 may be further included in the first die 600 in addition to the logic chip 610, according to the operation characteristics of the chip stack package 1000. The logic chip 610 and the functional chip 620 may be combined into a single chip structure or a chip stack structure.

For example, the functional chip 620 may include a graphic chip having a GPU from which relatively high operation heat (super heat) may be generated as compared with other chips and the logic chip 610 of the first die 600. In other words, the graphic chip may cause a hot spot HS of the first die 600.

The number and layout of the hot spots HS may be varied in the first die 600 according to the operation characteristics and functions of the chip stack package 1000. Thus, the hot spots HS may be variously distributed on the first die 600.

In an exemplary embodiment of the inventive concept, the first die 600 may be mounted onto the circuit board 700 in a face-up structure and the contact pad 630 of the first die 600 may be connected to the bonding pad 730 of the circuit board 700 through a bonding wire BW. Alternatively, the first die 600 may be mounted onto the circuit board 700 in a face-down structure and the contact pad 630 of the first die 600 may be contact with the bonding pad 730 of the circuit board 700 through bump structures such as a plurality of solder bumps.

The second die 500 may be mounted on the first die 600 in a face-down structure and may be electrically connected to the first die 600 through a bump structure. The second die 500 may include a memory device having the memory cell 110 for storing the digital data as a binary mode.

For example, the second die 500 may include a DRAM device having a transistor, a capacitor and a flash memory device. The flash memory device may include a plurality of memory cell blocks, a single string selection transistor, a single ground selection transistor and a plurality of cell transistors.

The second die 500 may include an IC chip structure 100 on which the digital data may be stored, the wiring structure 200 having the signal transfer structure 220 that may be connected to the IC chip structure 100 and may transfer operating signals to the IC chip structure 100, the thermal dispersion structure 250 that may disperse the super heat from the hot spot HS to decrease the temperature of the hot spot HS, and the heat transfer structure 300 for transferring the super heat to the thermal dispersion structure 250 from the hot spot HS of the first die 600.

The operating signals may be transferred to the memory cell 110 via a signal bump SB and the signal transfer structure 220. The super heat, which may be generated from a hot spot HS caused by the graphic chip of the first die 600, may be transferred to the thermal dispersion structure 250 via the heat bump 310. Thus, the super heat may be transferred to the thermal dispersion structure 250 and may be dispersed into the second die 500 to decrease the temperature of the hot spot HS.

For example, the super heat of the first die 600 may be directly transferred to the thermal dispersion structure 250 of the second die 500 and may be dispersed out of the first die 600. The dispersion of the super heat in the first die 600 may decrease the temperature of the first die 600 to increase the reliability and stability of the chip stack package 1000.

The second die 500 may have substantially the same structures as the memory device 500 shown in FIG. 1, so any further detailed descriptions on the second die 500 will be omitted.

In an exemplary embodiment of the inventive concept, the second die 500 may be flipped such that the active face of the second die 500 may face downwards and may be connected to the first die 600 by the contact structures such as the signal bumps SB and the heat bumps 310. The signal bumps SB and the heat bumps 310 may be interposed between the first and the second dies 600 and 500 by a reflow process, and a gap space between the first and the second dies 600 and 500 may be filled with an under-filling layer UF.

The first and the second dies 600 and 500 may be electrically connected to each other by the signal bumps SB and may be thermally connected to each other by the heat bumps 310. In addition, the first and the second dies 600 and 500 may be mechanically combined to each other by both of the signal bumps SB and the heat bumps 310 with a high reliability.

Since the heat bump 310 of the second die 500 are to be in contact with the hot spot HS of the first die 600, the second die 500 is combined with the first die 600 in such a way that the heat bump 310 may be aligned with the hot spot HS. Thus, the stack structure of the first and the second dies 600 and 500 may be determined by the layout of the first die 600, which may reduce the DOF of the device combination in the chip stack package 1000.

FIG. 6 is a cross-sectional view illustrating a chip stack package having a semiconductor memory device, according to an exemplary embodiment of the inventive concept. In FIG. 6, a chip stack package 1001 may have substantially the same structures as the chip stack package 1000 shown in FIG. 5, except that the second die 500 may be replaced with the semiconductor memory device 501 shown in FIG. 2A.

Referring to FIG. 6, the chip stack package 1001 may include the heat transfer circuit 320 that may be interposed between the first and the second dies 600 and 500, and may interconnect the heat bump 310 and the thermal dispersion structure 250 as a heat transfer path.

Thus, the first and the second dies 600 and 500 may be combined with each other irrespective of the positions of the functional chips 620 on the first die 600 and the layout of the thermal dispersion structures 250 on the second die 500. Thus, the DOF of the device combination of FIG. 6 may be increased.

As described above, the second die 500 may have substantially the same structures as the semiconductor memory device 501 shown in FIG. 2A, so any further detailed descriptions on the second die 500 of the chip stack package 1001 will be omitted.

A supplementary heat bump 315 may be further disposed on the capping pattern 301 between the first and the second dies 600 and 500 such that the supplementary heat bump 315 may be connected with the heat transfer circuit 320 and the second die 600.

When the super heat of the hot spot HS is transferred through the heat transfer circuit 320 to the thermal dispersion structure 250, a residual of the super heat HS may also be transferred to a cool spot CS of the second die 600 through the supplementary heat bump 315.

The cool spot CS may be a local area or portion of the second die 600 at which the temperature may be lower than that of the hot spot HS. Thus, a portion of the super heat HS may be dispersed into the thermal dispersion structure 250 and another portion of the super heat HS may be dispersed to the cool spot CS.

Accordingly, the temperature of the hot spot HS may be rapidly decreased and the thermal reliability of the chip stack package 1001 may be increased.

FIG. 7 is a cross-sectional view illustrating a chip stack package having a semiconductor memory device, according to an exemplary embodiment of the inventive concept. In FIG. 7, a chip stack package 1003 may have substantially the same structures as the chip stack package 1001 shown in FIG. 6, except that a lateral heat spreader may be disposed at sides of the first and the second dies 600 and 500.

Referring to FIG. 7, the chip stack package 1003 may include a lateral heat spreader 800 that may be disposed at sides of the first and the second dies 600 and 500 in a vertical direction with respect to the upper surface of the circuit board 700.

The heat transfer circuit 320 may further include an extension line 320A that may be in contact with the lateral heat spreader 800 so the super heat may be transferred to the lateral heat spreader 800 from the hot spot HS through the heat transfer circuit 320, and may be dissipated out of the package 1002 by the lateral heat spreader 800. The lateral heat spreader 800 may have substantially the same structures as the heat spreader 400 of the semiconductor memory device 503, so any detailed descriptions on the lateral heat spreader 800 will be omitted.

Thus, the super heat may be rapidly dissipated out of the chip stack package 1003 from the hot spot HS of the first die 600.

FIG. 8 a cross-sectional view illustrating a chip stack package having a semiconductor memory device, according to an exemplary embodiment of the inventive concept. In FIG. 8, a chip stack package 1004 may have substantially the same structures as the chip stack package 1000 shown in FIG. 5, except that the second die 500 may be replaced with the semiconductor memory device 503 shown in FIG. 4A.

Referring to FIG. 8, the chip stack package 1004 may include the heat spreader 400, which may be connected to the thermal dispersion structure 250 so the super heat may be dissipated out of the chip stack package 1004 by using the thermal dispersion structure 250. Accordingly, the super heat generated from the hot spot HS of the first die 600 may be dispersed into the thermal dispersion structure 250 and may be dissipated outwards by the heat spreader 400.

The heat column 150 may be provided with the first die 500 such that the heat column 150 may penetrate through the substrate 101 and the heat spreader 400 may directly contact the thermal dispersion structure 250 or the heat spreader 400 may contact the thermal dispersion structure 250 through the heat column 150. Thus, the super heat may be directly transferred to the heat spreader 400 from the thermal dispersion structure 250 via the heat column 150.

For example, the heat column 150 may include a through-silicon thermal via that may be connected with the heat spreader 400 and the thermal dispersion structure 250 through the substrate 101. The through-silicon thermal via may include a metal having high thermal conductivity such as copper (Cu), aluminum (Al), etc.

Therefore, the super heat generated from the hot spot HS of the first die 600 may be dispersed into thermal dispersion structure 250 through the heat bump 310 and may be dissipated out of the chip stack package 1003 through the heat spreader 400 by using the heat column 150. Accordingly, the chip stack package 1003 may not be subject to thermal damages caused by the super heat of the first die 600.

In an exemplary embodiment of the inventive concept, the first die 600 may include a logic device having a CPU for processing operating signals to a mobile system and a GPU for processing image signals to the mobile system, and the second die 500 may include a memory device into which digital data may be stored in response to the operating signals from the CPU. Thus, the above example chip stack packages 1000 to 1004 may be manufactured into an application processor (AP) for the mobile system.

According an exemplary embodiment of the inventive concept, in a semiconductor memory device and a chip stack package including the same, the wiring structure of the memory device may include a signal transfer structure for transferring operating signals to memory cells and a thermal dispersion structure for dispersing the super heat from a hot spot of another device that may be combined with the memory device.

Thus, when the memory device is combined with a logic device having the hot spot, such as a graphic chip, and is manufactured into a chip stack package having the memory device and the logic device, the operating signals may be transferred to the memory cell through the signal transfer structures and the super heat of the hot spot may be dissipated into the thermal dispersion structures of the memory device. Thus, the super heat generated from the hot spot of the logic device may be dispersed into the thermal dispersion structure of the memory device so that the super heat may be widely dispersed in the chip stack package.

For example, the thermal dispersion structure may be connected to a local well of the substrate, the local well having a different conductivity type than the substrate, so the thermal dispersion structures may be electrically separated from the memory cell which is connected with the signal transfer structure. Thus, when the chip stack package has one power source and thus the memory device and the local device may be operated by the same power source, the memory cell may not be subject to signal interferences and signal noises. In addition, the thermal dispersion structure may be formed simultaneously with the signal transfer structure in the same process so no additional process may be needed to make the thermal dispersion structure.

A re-directional layer structure may be further provided on the memory device and the thermal dispersion structures such that the hot spots may be connected with one another irrespective of the positions and the layout of the thermal dispersion structures, thereby increasing the DOF of the device combination in the chip stack package.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor memory device comprising:
   an integrated circuit (IC) chip structure,
   wherein the IC chip structure includes:
      a substrate;
      a memory cell disposed on the substrate; and
      a local well disposed on the substrate, wherein a conductivity type of the local well is different from a conductivity type of the substrate;
   a wiring stack structure disposed on the IC chip structure, wherein the wiring stack structure includes a signal transfer pattern connected to the memory cell through a signal interconnector, and a thermal dispersion pattern connected to the local well through a thermal interconnector;
   a heat transfer structure connected to the thermal dispersion pattern for transferring heat to the thermal dispersion pattern from a heat source; and
   at least one heat bump between the heat source and the thermal interconnector.

2. The semiconductor memory device of claim 1, wherein each of the signal transfer pattern and the thermal dispersion pattern includes a metal pattern, wherein the metal pattern of the signal transfer pattern and the metal pattern of the thermal dispersion pattern have a same stack structure, and wherein the signal interconnector and the thermal interconnector includes a same metal via structure.

3. The semiconductor memory device of claim 1, wherein the at least one heat bump is in contact with the heat source and the thermal interconnector.

4. The semiconductor memory device of claim 1, wherein the heat transfer structure includes:
   a heat transfer circuit connected with the at least one heat bump and the thermal dispersion pattern.

5. The semiconductor memory device of claim 4, wherein the heat transfer circuit includes:
   a first heat transfer line connected to the at least one heat bump and a second heat transfer line connected to the thermal dispersion pattern;
   a first bridge via connected to the first heat transfer line and a second bridge via connected to the second heat transfer line; and
   a bridge line connected to the first and second bridge vias.

6. A semiconductor memory device comprising:
   an integrated circuit (IC) chip structure,
   wherein the IC chip structure includes:
      a substrate; and
      a memory cell disposed on the substrate;
   a wiring stack structure disposed on the IC chip structure, wherein the wiring stack structure includes a signal transfer pattern connected to the memory cell through a signal interconnector, and a thermal dispersion pattern connected to the semiconductor substrate through a thermal interconnector, wherein the signal interconnector transfers operating signals to the memory cell;
   a heat spreader disposed on the substrate and connected to the thermal dispersion pattern such that heat is dissipated from the thermal dispersion pattern through the heat spreader; and
   a heat transfer structure connected to the thermal dispersion pattern and transferring the heat from a heat source to the thermal dispersion pattern, wherein the heat transfer structure includes:
   at least one heat bump connected with the heat source.

7. The semiconductor memory device of claim 6, further comprising a heat column, wherein the heat column is connected with the heat spreader and the thermal dispersion pattern through the substrate.

8. The semiconductor memory device of claim 6, wherein the heat transfer structure includes:

a heat transfer circuit connected with the heat bump and the thermal dispersion pattern.

9. A chip stack package comprising:
a circuit board including at least one conductive pattern;
a first die mounted on the circuit board, the first die including a first chip and at least one second chip that generates more heat than the first chip, wherein a portion of the first die that is heated from the at least one second chip is a hot spot; and
a second die stacked on the first die and connected to the first die,
wherein the second die includes:
an integrated circuit (IC) chip structure on which data is stored;
a wiring stack structure, the wiring stack structure including a signal transfer pattern connected to the IC chip structure for transferring operating signals to the IC chip structure, and a thermal dispersion pattern that disperses the heat from the hot spot; and
a heat transfer structure for transferring the heat from the hot spot to the thermal dispersion pattern.

10. The chip stack package of claim 9, wherein the IC chip structure includes:
a substrate;
a memory cell disposed on the substrate; and
a local well disposed on the substrate, wherein a conductivity type of the local well is different from a conductivity type of the substrate,
wherein the wiring stack structure is disposed on the IC chip structure, wherein the wiring stack structure includes a signal transfer pattern connected to the memory cell through a signal interconnector, and a thermal dispersion pattern connected to the local well through a thermal interconnector, and
wherein the heat transfer structure includes at least one heat bump contacting the hot spot, and a heat transfer circuit connected to the thermal dispersion pattern and to the at least one heat bump.

11. The chip stack package of claim 10, further comprising a lateral heat spreader disposed on at least one side of the second die,
wherein the lateral heat spreader is connected to the heat transfer circuit such that the heat of the hot spot is dissipated through the lateral heat spreader.

12. The chip stack package of claim 9, wherein the IC chip structure includes:
a substrate;
a memory cell disposed on the substrate; and
a heat column penetrating the substrate,
wherein the wiring stack structure is stacked on the IC chip structure, wherein the wiring stack structure includes a signal transfer pattern connected to the memory cell through a signal interconnector, and a thermal dispersion pattern connected to the local well through a thermal interconnector, and
wherein the heat transfer structure includes at least one heat bump contacting the hot spot, and a heat transfer circuit connected to the thermal dispersion pattern and to the at least one heat bump.

13. The chip stack package of claim 12, wherein, when the substrate includes a first surface and a second surface opposite to the first surface, and the memory cell is disposed on the first surface, the second die further includes a heat spreader disposed on the second surface, and
wherein the heat spreader contacts the heat column to dissipate heat from the thermal dispersion pattern.

14. The chip stack package of claim 9, wherein the first die is connected to the circuit board by using a bonding wire, and
wherein the second die is connected to the first die by using a conductive bump structure.

15. The chip stack package of claim 9, wherein the first chip of the first die includes a central process unit (CPU) or a graphic processing unit (GPU), and the second die includes a memory device into which data is stored in response to signals from the CPU or the GPU.

16. A semiconductor memory device comprising:
an integrated circuit (IC) chip structure,
wherein the IC chip structure includes:
a substrate;
a memory cell disposed on the substrate; and
a local well disposed on the substrate, wherein a conductivity type of the local well is different from a conductivity type of the substrate;
a wiring stack structure disposed on the IC chip structure, wherein the wiring stack structure includes a signal transfer pattern, a thermal dispersion pattern, a first insulation layer, and a second insulation layer stacked on the first insulation layer,
wherein the signal transfer pattern includes a first metal pattern disposed on the first insulation layer, a second metal pattern disposed on the second insulation layer, and a signal interconnector connected to the memory cell and to the first and second metal patterns,
wherein the thermal dispersion pattern includes a third metal pattern disposed on the first insulation layer, a fourth metal pattern disposed on the second insulation layer, and a thermal interconnector connected to the local well and to the third and fourth metal patterns; and
a heat transfer structure connected to the thermal interconnector for transferring heat to the third and fourth metal patterns,
wherein the first and third metal patterns are disposed at a same level as each other with respect to the substrate and the second and fourth metal patterns are disposed at a same level as each other with respect to the substrate.

17. The semiconductor memory device of claim 16, wherein the first metal pattern and the third metal pattern include a same material.

18. The semiconductor memory device of claim 16, wherein the third and fourth metal patterns are connected to each other by a heat-conducting material.

19. The semiconductor memory device of claim 16, wherein the first metal pattern overlaps the second metal pattern.

20. The semiconductor memory device of claim 16, wherein the third metal pattern overlaps the fourth metal pattern.

* * * * *